United States Patent
Le et al.

(10) Patent No.: US 7,075,793 B2
(45) Date of Patent: Jul. 11, 2006

(54) DEVICE HAVING A SLOT CAPABLE OF RECEIVING AT LEAST FOUR TYPES OF MEMORY CARDS

(75) Inventors: Trung V. Le, White Bear Township, MN (US); Robert W. Tapani, Oakdale, MN (US)

(73) Assignee: Imation Corp., Oakdale, MN (US)

(*) Notice: Subject to any disclaimer, the term of this patent is extended or adjusted under 35 U.S.C. 154(b) by 230 days.

(21) Appl. No.: 10/815,367

(22) Filed: Apr. 1, 2004

(65) Prior Publication Data

US 2004/0184246 A1    Sep. 23, 2004

Related U.S. Application Data

(62) Division of application No. 09/992,712, filed on Nov. 19, 2001, now Pat. No. 6,738,259.

(51) Int. Cl.
*H05K 1/14* (2006.01)

(52) U.S. Cl. .................. 361/737; 361/785; 361/787; 439/74

(58) Field of Classification Search ............ 361/737, 361/787, 785, 760; 439/945–948, 630–631, 439/74, 377
See application file for complete search history.

(56) References Cited

U.S. PATENT DOCUMENTS

| | | | |
|---|---|---|---|
| 5,155,663 A * | 10/1992 | Harase | 361/684 |
| 5,901,049 A | 5/1999 | Schmidt et al. | |
| 6,010,066 A | 1/2000 | Itou et al. | |
| 6,097,605 A | 8/2000 | Klatt et al. | |
| 6,132,223 A | 10/2000 | Seeley et al. | |
| 6,250,965 B1 | 6/2001 | Neifer | |
| 6,402,529 B1 | 6/2002 | Saito et al. | |
| 6,612,492 B1 * | 9/2003 | Yen | 235/451 |
| 6,684,283 B1 * | 1/2004 | Harris et al. | 710/302 |
| 6,751,694 B1 * | 6/2004 | Liu et al. | 710/301 |

\* cited by examiner

*Primary Examiner*—Kamand Cuneo
*Assistant Examiner*—Hung S. Bui
(74) *Attorney, Agent, or Firm*—Eric D. Levinson

(57) ABSTRACT

An apparatus, such as a reader, adapter, or other device, is described that is capable of receiving at least four different types of memory cards using a single slot. The slot includes a central region having a width to receive a memory card of a first type, first outer regions that extend the width of the central region to a second width to receive a memory card selected from a second type of memory card or a third type of memory card, and second outer regions that extend the width of the central region to a third width to receive a memory card of a fourth type. A plurality of electrically conductive contact areas are disposed within the slot. The apparatus may receive, for example, any of a Smart Media flash memory card, Memory Stick flash memory card, Secure Digital flash memory card, or MultiMedia flash memory card.

20 Claims, 9 Drawing Sheets

DEVICE HAVING A SLOT CAPABLE OF RECEIVING AT LEAST FOUR TYPES OF MEMORY CARDS

This application is a divisional application of U.S. patent application Ser. No. 09/992,712, entitled "APPARATUS SUPPORTING MULTIPLE MEMORY CARD FORMATS," filed Nov. 19, 2001, now U.S. Pat. No. 6,738,259 the entire content of which is incorporated herein by reference.

TECHNICAL FIELD

The invention relates to removable storage media devices and, in particular, removable memory cards.

BACKGROUND

A wide variety of removable storage media exists for use with voice recorders, digital video camcorders, digital cameras, personal digital assistants (PDAs), cellular phones, video games, digital televisions, photo printers, and the like. The storage media allows users to capture and store data on such devices, and easily transport the data between these various devices and a computer.

One of the most popular types of removable storage devices is the flash memory card, which is compact, easy to use, and has no moving parts. A flash memory card includes an internal, high-speed solid-state memory capable of persistently storing data even without application of power.

A wide variety of flash memory cards have been recently introduced that have different capacities, access speeds, formats, and interfaces. Example of flash memory cards include CompactFlash™ first introduced by SanDisk™ Corporation, the Memory Stick™ (MS) developed by Sony Corporation, Smart Media™ memory cards, Secure Digital (SD) memory cards, and MultiMedia Cards (MMCs) jointly developed by SanDisk Corporation and Siemens AG/Infineon Technologies AG.

Each of the various types of flash memory devices has unique electrical and mechanical interfaces. Type I CompactFlash memory cards, for example, measure approximately 36 mm×43 mm×3.3 mm. Memory Sticks developed by Sony Corporation have sizes of approximately 21.5 mm×50 mm×2.8 mm and have either four (4) conductive pins or ten (10) conductive pins. Smart Media measures approximately 45.0 mm×37.0 mm×0.76 mm and has 22 conductive pins. SecureDigital flash cards measure 32 mm×24 mm×2.1 mm. MultiMedia Cards measure 32.0 mm×24.0 mm×1.40 mm.

Except for Type II CompactFlash memory cards that conform to the specifications for the Personal Computer Memory Card International Association (PCMCIA) interface, each type of flash memory device generally requires a specialized adapter or reader for use with a computing device. An adapter includes a specialized interface that conforms to the supported type of flash memory card, and converts the signals received from the card to a standard interface readable by a computer. An adapter may, for example, convert the signals to the PCMCIA interface, the Universal Serial Bus (USB) interface, the Small Computer System Interface (SCSI) interface, or a conventional serial or parallel interface. Most conventional adapters support a single type of flash memory cards, causing a user to carry and interchange adapters when using different types of memory cards.

SUMMARY

In general, the invention is directed to an apparatus capable of receiving a number of different types of flash memory cards using a single slot. For example, the apparatus supports the mechanical and electrical interfaces necessary for receiving flash memory cards conforming to a variety of formats including Memory Stick memory cards, Smart Media memory cards, Secure Digital memory cards, and MultiMedia Cards. The apparatus may, for example, comprise an adapter for direct coupling to a computing device or a stand-alone reader for accessing the memory card.

In one embodiment, an apparatus comprises a housing defining a slot to receive one of at least four different types of removable memory cards. The slot includes a central region having a width to receive a memory card of a first type, first outer regions that extend the width of the central region to a second width to receive a memory card selected from a second type of memory card or a third type of memory card, and second outer regions that extend the width of the central region to a third width to receive a memory card of a fourth type. A plurality of electrically conductive contact areas are disposed within the slot to provide electrical contact with the four different types of memory cards.

In another embodiment, an apparatus comprises a plurality of electrically conductive contact areas disposed within a cavity to provide electrical contact with at least four different types of removable memory cards. The cavity includes a central region having a width to receive a Memory Stick removable memory card, first outer regions that extend the width of the central region to a second width to receive a MultiMedia removable memory card or a Secure Digital removable memory card, and second outer regions that extend the width of the central region to a third width to receive a Smart Media removable memory card.

In another embodiment, a system comprises an adapter having a slot to receive one of at least four different types of removable memory cards, wherein the slot includes a central region having a width to receive a memory card of a first type, first outer regions that extend the width of the central region to a second width to receive a memory card selected from a second type of memory card or a third type of memory card, and second outer regions that extend the width of the central region to a third width to receive a memory card of a fourth type. The system further comprises a computing device having a port to receive the adapter.

The invention may be capable of providing one or more advantages. A user may, for example, interchange different types of memory cards without having to use multiple adapters. Consequently, a user may capture and store data on memory cards of a number of different formats using a number of different digital devices, and then transfer the data to a computing device using a single adapter. The user need not purchase and carry a number of different adapters for each digital device owned by the user, such as a digital camera, a digital voice recorder, a personal digital assistant, and the like.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
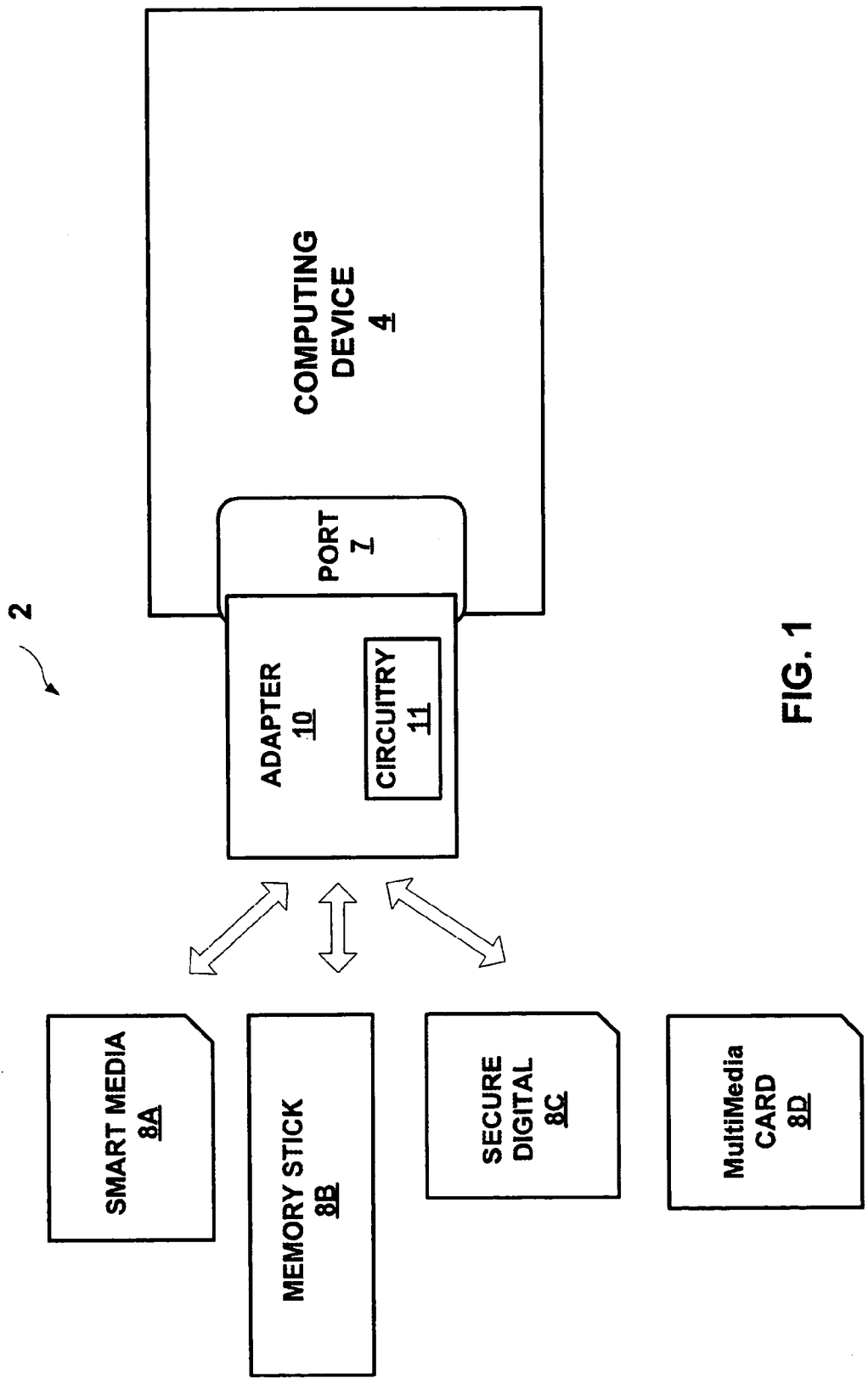
FIG. 1 is a block diagram illustrating a system in which a single adapter can be used with a variety of different types of removable memory cards.

FIG. 1 is a block diagram illustrating a system 2 in which a single adapter 10 can be used with a variety of different types of removable memory cards 8. In particular, adapter 10, as discussed in detail below, can receive at least four different types of memory cards, including any one of Smart Media flash memory card 8A, Memory Stick flash memory 8B, Secure Digital memory card 8C, and MultiMedia flash memory card 8D. In this fashion, a user may capture and store data on memory cards 8 using a number of different digital devices, and then transfer the data to computing device 4 using a single adapter 10. Computing device 4 may be any type of computing device including the laptop computer, a desktop computer, a personal digital assistant (PDA), or the like.

Adapter 10 can be mechanically and electrically coupled to port 7 of computing device 4. Port 7 may be, for example, a Personal Computer Memory Card International Association (PCMCIA) connector. Alternatively, port 7 may be a Universal Serial Bus (USB) connector, a connector conforming to IEEE 1394, a Small Computer System Interface (SCSI) connector, or any conventional serial or parallel connector. In one embodiment, the dimensions of adapter 10 conform to the specification for a Type II Compact Flash. Consequently, adapter 10 can be used with any interface configured to receive a Compact Flash memory card.

Adapter 10 may include electronic circuitry 11 to convert electrical signals received from flash memory cards 8 to the appropriate format and voltages required by port 7. Alternatively, adapter 10 may be a passive adapter that routes electrical signals received from flash memory cards 8 to the appropriate pins within port 7.

Figure 2:
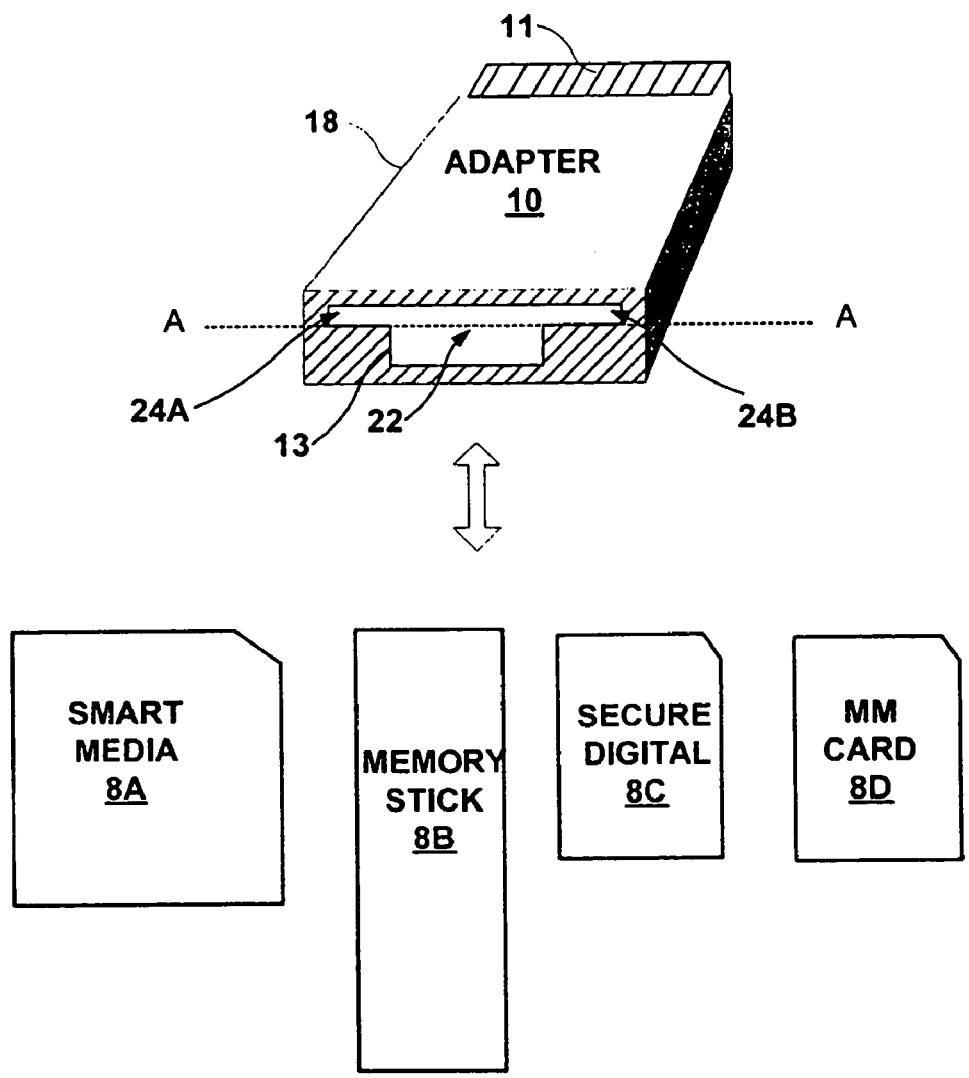
FIG. 2 is a perspective view illustrating one embodiment of the adapter in further detail.

FIG. 2 is a perspective view illustrating one embodiment of adapter 10 in further detail. In particular, adapter 10 includes housing 18 having a slot 13 for receiving a variety of different types of flash memory cards 8. Unlike some conventional adapters that support different types of flash memory cards by making use of multiple slots, adapter 10 has a single slot 13 that is structured to prevent a user from incorrectly inserting flash memory cards 8. Housing 18 may be formed from injection molded plastic.

Specifically, slot 13 includes a central region 22 and outer regions 24A and 24B that extend the width of slot 13. Outer regions 24 have a narrower slot height than central region 22. As described in detail below, slot 13 can accommodate any one of Smart Media memory card 8A, Memory Stick flash memory card 8B, Secure Digital memory card 8C, and MultiMedia flash memory card 8D. These formats of flash memory cards 8 are described for exemplary purposes, and the principles of the invention are not limited to these types of memory cards. Interface 11 provides an electrical interface for electrically coupling adapter 10 to port 7 of computing device 4.

Figure 3:
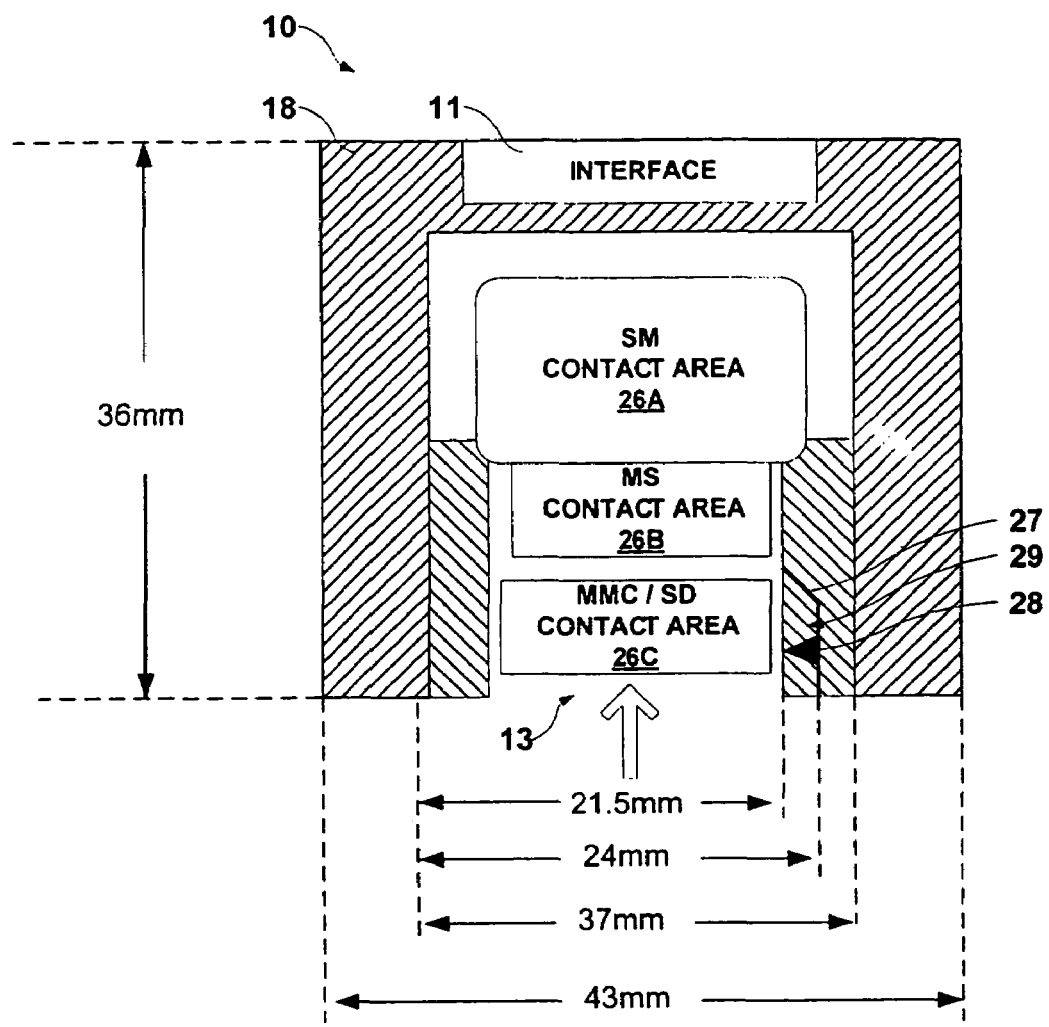
FIG. 3 is a cross-sectional plan view through the adapter illustrating the arrangement of a plurality of electrical contact areas within the adapter.

FIG. 3 is a cross-sectional plan view through slice A (FIG. 2) of adapter 10, and illustrates the arrangement of a plurality of electrical contact areas 26 within adapter 10. Electrical contact areas 26 provide separate electrically conductive interfaces for the various types of flash memory 8 supported by adapter 10. Contact areas 26 are primarily arranged within slot 13 according to the physical length of the corresponding memory card 8 with which the contact area 26 is designed to interact. Specifically, contact areas 26 for shorter memory cards 8 are located closer to the front of slot 13. Conversely, contact areas 26 for longer memory cards 8 are located near the back of slot 13.

Each contact area 26 is tailored to electrically interface with one or more memory cards 8. For example, Smart Media (SM) contact area 26A has 22 conductive pins (not shown) for interacting with a Smart Media flash memory card 8A. Similarly, Memory Stick (MS) contact area 26B has 4 pins (not shown) for interacting with a Memory Stick flash memory card 8B. Contact area 26C is used to interact with a Secure Digital memory card (SD) 8C or a MultiMedia flash memory card (MMC) 8D. Contacts 26 may be coupled to conductive paths that extend through housing 18 of adapter 10 to engage interface 11. Adapter 10 includes a tapered insertion stop 27 that limits the insertion depth of a MultiMedia flash memory card 8B and a Secure Digital memory card 8C. Insertion stop 27 defines a recess 29 with a wall that engages the tapered outer surface of the memory card 8C or 8D upon insertion.

Figure 4:
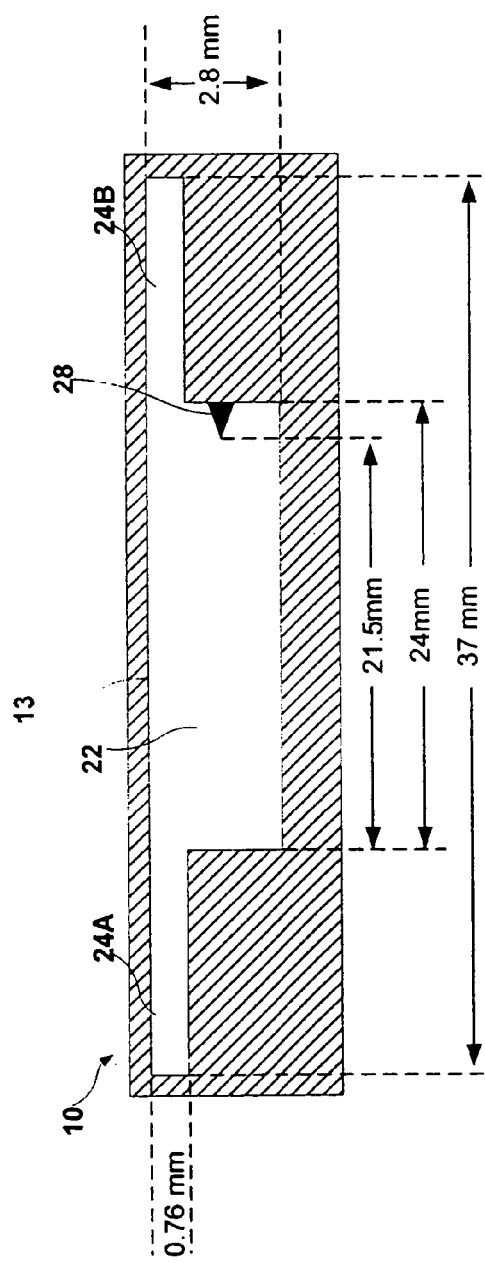
FIG. 4 is a schematic diagram illustrating a front view of the adapter.

FIG. 4 is a schematic diagram illustrating a front view of adapter 10. Slot 13 includes a central region 22 having a height of approximately 2.8 mm and a width of approximately 24 mm. Slot 13 further includes outer regions 24A and 24B that have heights of approximately 0.76 mm, and which extend the width of slot 13 to provide a total slot width of approximately 37 mm. In this manner, slot 13 can accommodate Smart Media memory card 8A that has a width of 37 mm and a height of 0.76 mm. To accommodate Memory Stick flash memory card 8B, adapter 10 includes a bias mechanism 28 that is biased outward to limit the width of central region 22 to 21.5 mm. Consequently, central region 13 can receive Memory Stick flash memory card 8B, which has a width of 21.5 mm and a height of 2.8 mm. Bias mechanism 28 is biased inward to contract upon insertion of either a Secure Digital memory card 8C or a MultiMedia flash memory card 8D that have widths of 24 mm. Bias mechanism 28 may take the form of a leaf spring that is insert-molded into housing 18 of adapter 10.

Figure 5:
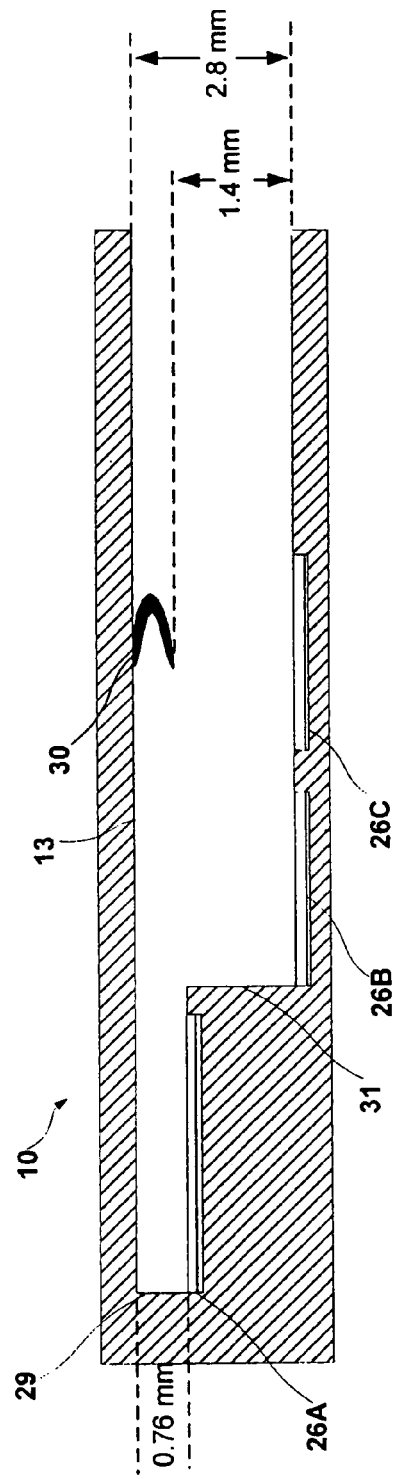
FIG. 5 is a schematic diagram illustrating a front view of the adapter.

FIG. 5 is a schematic diagram illustrating a side view of adapter 10 including slot 13 and electrical contact areas 26. The various memory cards 8 achieve different insertion depths within slot 13. During insertion, Smart Media memory card 8A, which has a height of 0.76 mm, travels into slot 13 (right to left on FIG. 5) until reaching rear wall 29 of slot 13. Memory Stick memory card 8B, which has a height of 2.8 mm, travels into slot 13 until reaching insertion stop 31. The insertion depth of Secure Digital Memory card 8C and MultiMedia memory card 8D are limited by insertion stop 27 (FIG. 3), which is angled to match the physical profile of these types of flash memory cards.

Adapter 10 may include a second bias mechanism 30 located within slot 13 to exert a downward force to insure proper electrical contact between an inserted memory card 8 and contact areas 26. In addition, the contact pads associated with contact areas 26 may, themselves, be spring-biased toward the interior of adapter housing 18. In particular, the bias mechanism 30 expands to reduce the height of slot 13 to accommodate MultiMedia card 8D that has a height of 1.4 mm. Upon insertion of a Secure Digital memory card 8C, bias mechanism 30 is biased upward to the appropriate height of 2.1 mm. Finally, upon insertion of a Memory Stick 8B that has a height of 2.8 mm, or Smart Media flash memory card 8A that has a height of 0.76 mm, bias mechanism 30 is biased upward completely. Bias mechanism 30 may be, for example, a spring-loaded lever, a spring-loaded pin, or the like.

Figure 6:
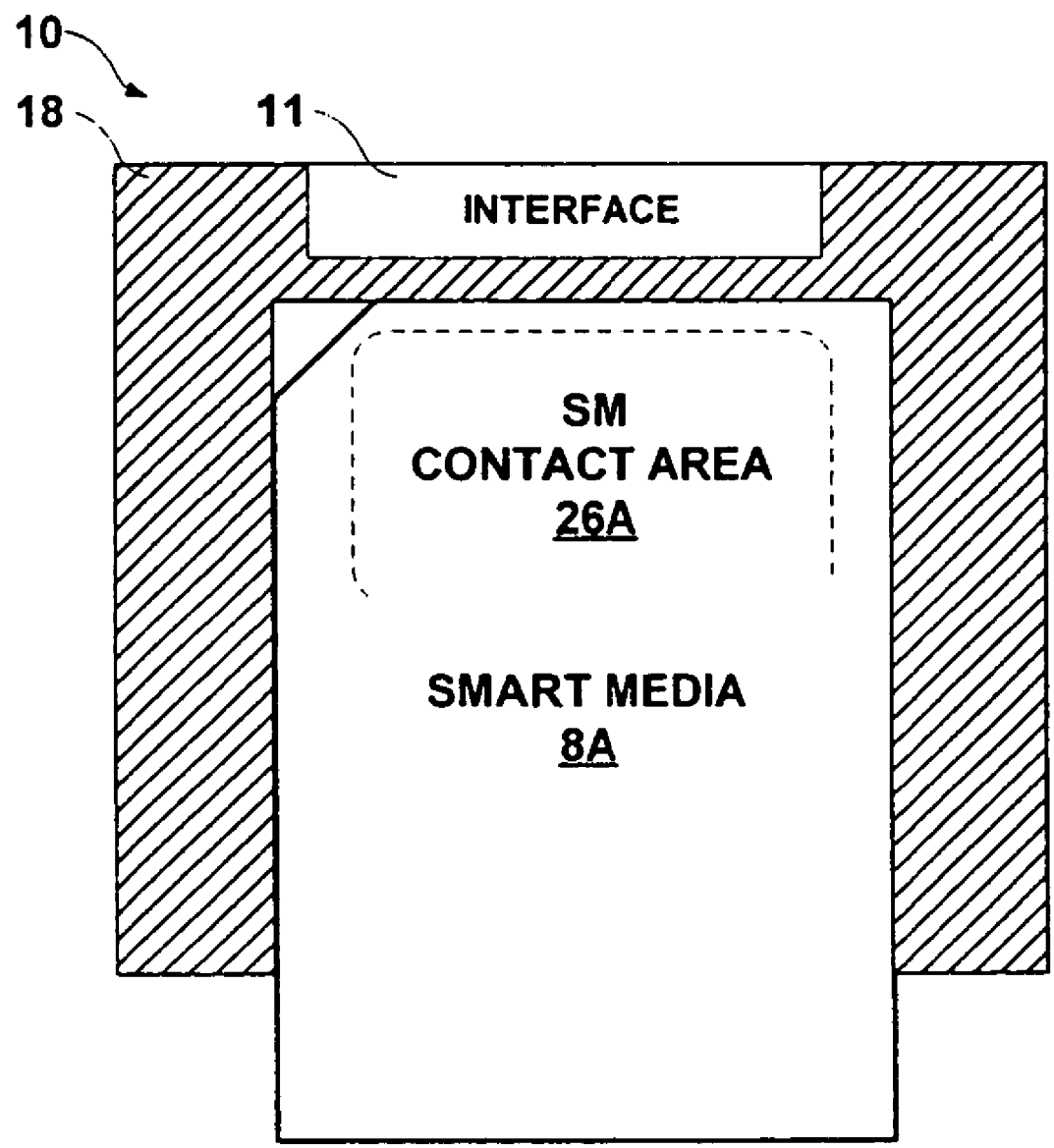
FIG. 6 is a schematic diagram illustrating the insertion of a Smart Media flash memory card within the adapter.

FIG. 6 is a schematic diagram illustrating the insertion of Smart Media flash memory card 8A within adapter 10. In particular, Smart Media flash memory card 8A is inserted within the widest portion of slot 13 including central region 22 and outer regions 24A and 24B (FIG. 4). During insertion, Smart Media flash memory card 8A travels into slot 13 and makes contact with Smart Media contact area 26A near the back of adapter 10. Notably, due to a width of 37 mm, Smart Media 8A cannot be inserted into other areas of slot 13 within adapter 10. Accordingly, Smart Media card 8A fits tightly within slot 13.

Figure 7:
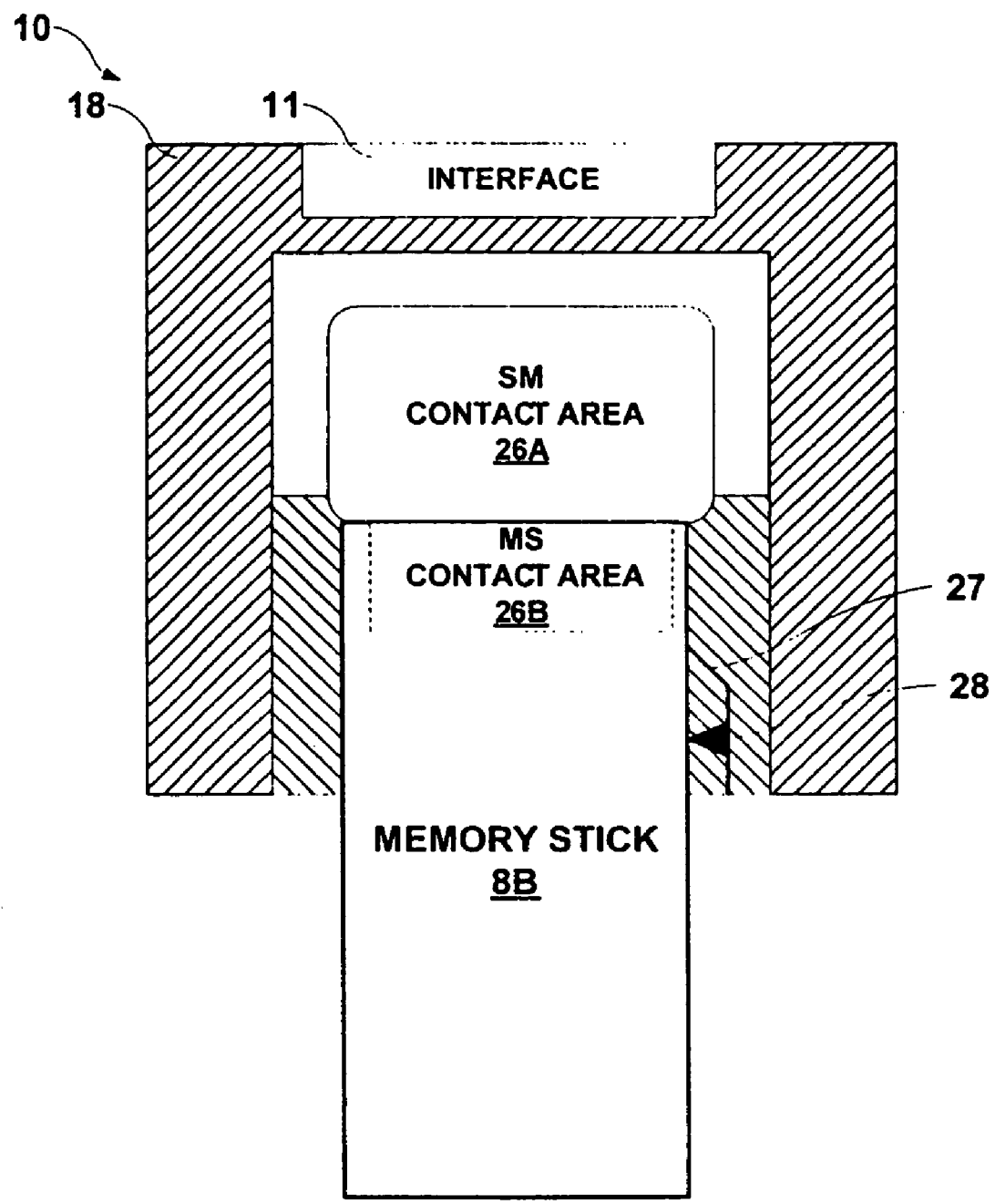
FIG. 7 is a schematic diagram illustrating the insertion of a Memory Stick memory card into the adapter.

FIG. 7 is a schematic diagram illustrating the insertion of a Memory Stick memory card 8B into adapter 10. In particular, Memory Stick 8B travels into central region 22 of slot 13 (FIG. 4) and is biased away from insertion stop 27 via bias mechanism 28 until reaching insertion stop 31 (FIG. 5). In this manner, Memory Stick flash memory card 8B is limited from further travel down slot 13, and therefore contacts Memory Stick contact area 26B, but is limited from contacting Smart Media contact area 26A. Due to a height of 2.8 mm, Memory Stick 8B fits tightly within the vertical dimension of central region 22 of slot 13. Bias mechanism 28 is provided, however, to ensure a snug fit of the Memory Stick 8B in the horizontal dimension.

Figure 8:
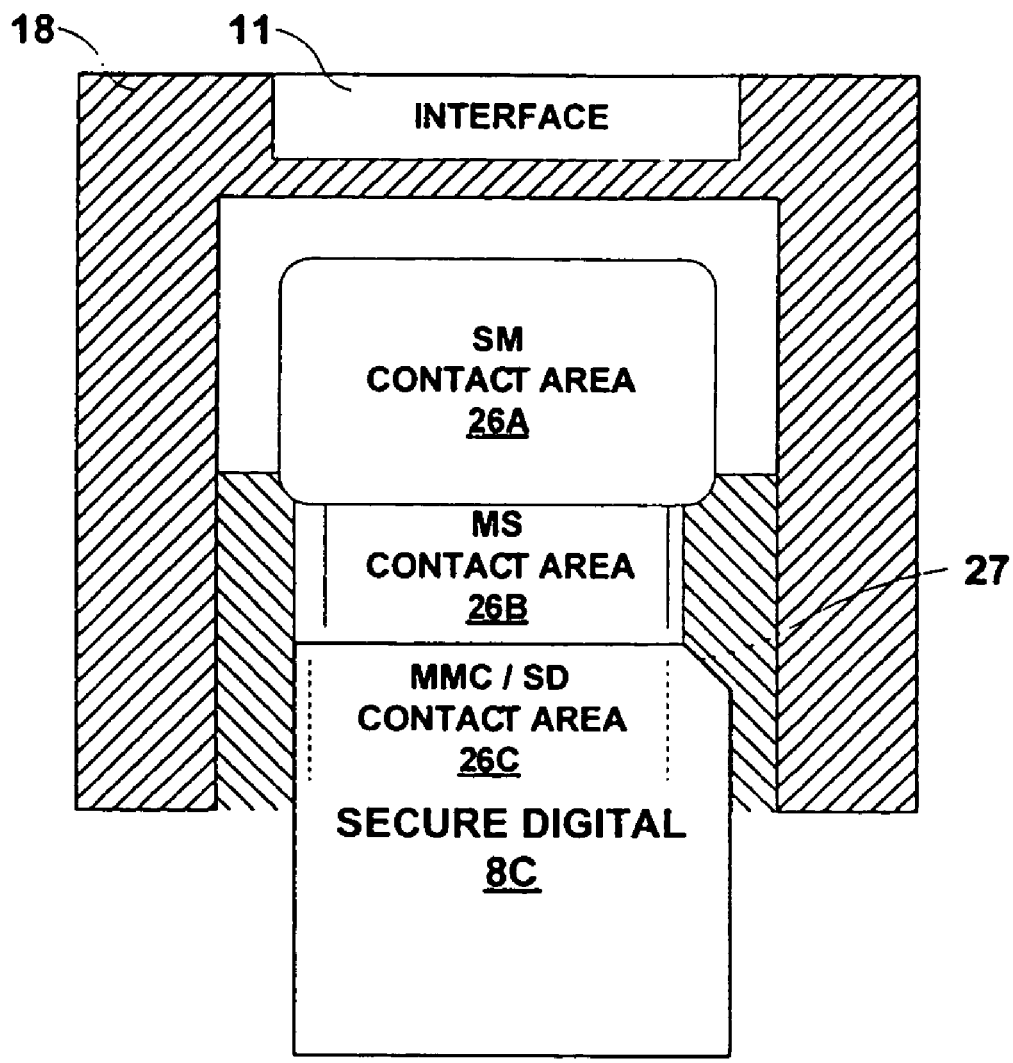
FIG. 8 is a schematic diagram illustrating the insertion of a Secure Digital memory card within the adapter.

FIG. 8 is a schematic diagram illustrating the insertion of Secure Digital memory card 8C within adapter 10. Because Secure Digital memory card 8C and MultiMedia card 8D are the shortest in length of memory cards 8, their corresponding contact area 26C is located toward the front of slot 13 of adapter 10. Insertion stop 27 limits the insertion of Secure Digital flash memory card 8C, and aligns the card with the appropriate contact area 26C.

Due to a width of 24 mm, Secure Digital flash memory card 8C fits tightly within central region 22 of slot 13. Although memory card 8C has a height of less than 2.8 mm, bias mechanism 30 restrains Secure Digital flash memory card 8C from vertical movement, and insures proper contact with contact area 26C. Although not illustrated, MultiMedia card 8B uses the same portion of slot 13 and the same contact area 26C as Secure Digital flash memory card 8C. As with Secure Digital flash memory card 8C, bias mechanism 30 limits the vertical movement of MultiMedia card 8B within slot 13.

Figure 9:
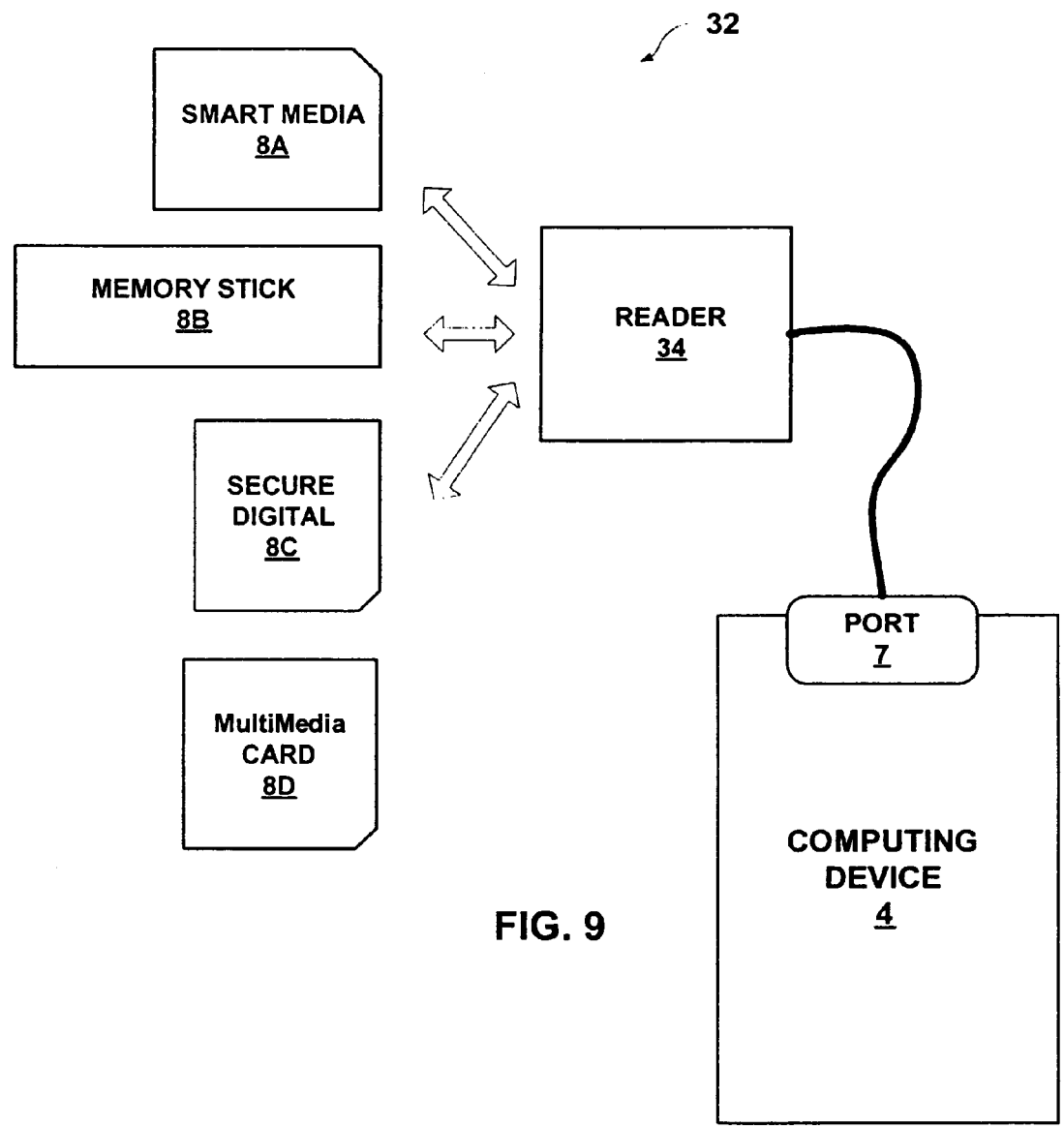
FIG. 9 is a block diagram illustrating a system in which a memory card reader is configured to accept a plurality of different types of memory cards.

FIG. 9 is a block diagram illustrating a system 32 in which a memory card reader 34 is configured to accept a plurality of different types of memory cards 8. In particular, adapter 10 includes housing 18 having a slot and a plurality of electrical contact areas for receiving a variety of different types of flash memory cards 8 as described above.

Reader 34 may include electronic circuitry for translating electrical signals received from memory cards 8 to the proper format and voltage according to the interface provided by port 7. Computing device 4 may be any type of computing device including the laptop computer, a desktop computer, a personal digital assistant (PDA), or the like.

Figure 10:
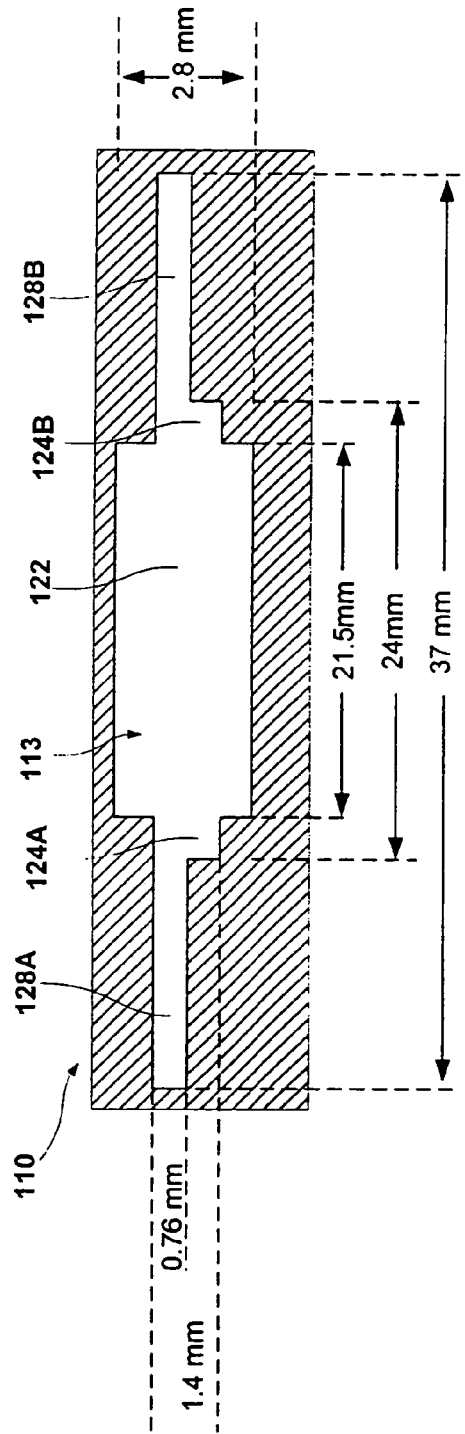
FIG. 10 is a schematic diagram illustrating a front view of another embodiment of the adapter.
Figure 11:
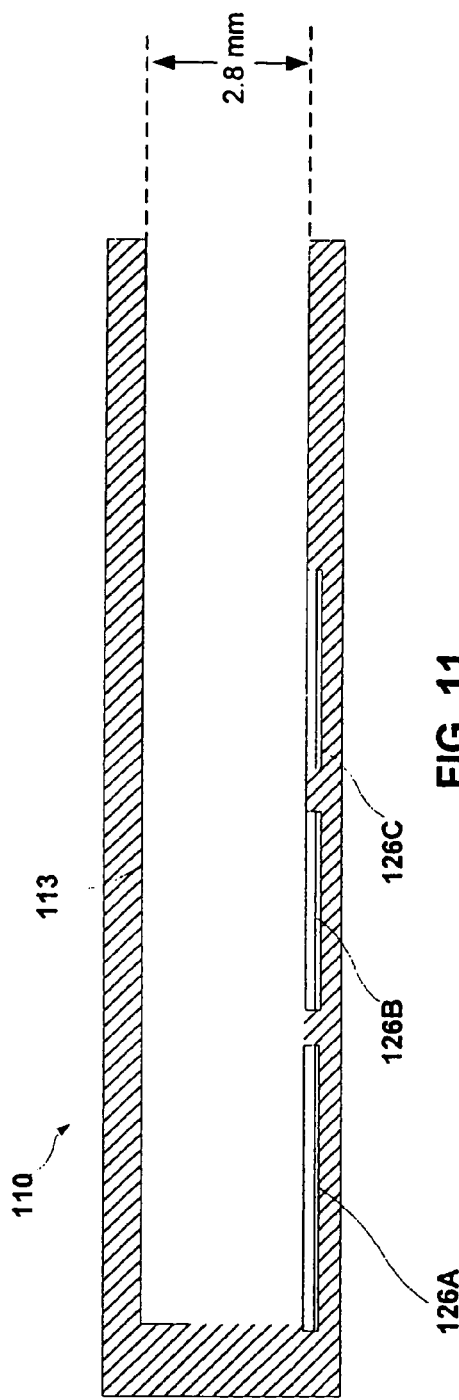
FIG. 11 is the corresponding side view of the adapter illustrated in FIG. 10.

FIGS. 10 and 11 illustrate another example embodiment for the adapter. In particular, FIG. 10 is a schematic diagram illustrating a front view of adapter 110, and FIG. 11 is the corresponding side view of adapter 110. As shown, adapter 110 includes a housing defining slot 113 and also includes electrical contact areas 126 disposed within the housing. In this embodiment, slot 113 is formed for receiving at least four different types of memory cards, possibly without the use of any biasing mechanisms. In particular, slot 113 includes a central region 122 that has height and width to receive Memory Stick memory card 8B. For example, the central region 122 has a height of approximately 2.8 mm and a width of approximately 21.5 mm specifically corresponding to the height and width of Memory Stick memory card 8B. Upon insertion, Memory Stick memory card 8B travels into slot 113 until card 8B electronically engages contact area 126A.

Slot 113 also includes first outer regions 124A and 124B that define heights and widths to receive Secure Digital memory card 8C and MultiMedia memory card 8D. For example, the first outer regions 124A and 124B define the region of slot 113 that has a height of approximately 1.4 mm and a width of approximately 24 mm, specifically for receiving MultiMedia card 8D. Specifically, the height for receiving Secure Digital memory card 8C and MultiMedia card 8D is defined by the height of first outer regions 124A and 124B. Similarly, the width is defined by the extension of the first outer regions 124A and 124B to the central region 122. Upon insertion, Secure Digital memory card 8C and MultiMedia card 8D travels into slot 113 (right to left on FIG. 11) until electronically engaging contact area 126C.

Slot 113 further includes second outer regions 128A and 128B that define heights and widths to receive Smart Media memory card 8A. Specifically the height for receiving Smart Media memory card 8A is defined by the second outer regions 128A and 128B, and the width is defined by the extension of the second outer regions 128A and 128B to the central region 122 and the first outer regions 124A and 124B. Thus, the second outer regions 128A and 128B define a height of approximately 0.76 mm and a width of approximately 37 mm. Upon insertion, Smart Media memory card 8A travels into slot 113 (right to left on FIG. 11) until card 8A electronically engages contact area 126B.

The cavity formed within the housing may include insertion stops to ensure that various memory cards can travel into slot 113 only until the respective card is aligned with the corresponding contact area, thus facilitating electrical engagement between a given memory card and the corresponding contact area. Additionally or alternatively, the cavity defined by slot 113 can be formed such that insertion of each respective memory card is inhibited at a defined point so as to align the card with the corresponding contact area, and result in electrical engagement between the card and the corresponding contact area. Each contact area may protrude from the cavity formed by slot 113 to better facilitate electrical contact with the corresponding memory card. In some embodiments, one or more of the contact areas exert a biasing force against the memory cards. Additional biasing mechanisms could also be added, although they may not be necessary in the embodiment illustrated in FIGS. 10 and 11.

Various embodiments of the invention have been described. For example, an apparatus has been described that is capable of receiving a number of different types of memory cards using a single slot. For example, the apparatus supports the mechanical and electrical interfaces necessary for receiving a memory card of a variety of formats including Memory Stick memory cards, Smart Media memory cards, Secure Digital memory cards, and MultiMedia Cards. In this manner, a user may interchange different types of memory cards without having to use multiple adapters. Consequently, a user may capture and store data on memory cards of a number of different formats using a number of different digital devices, and then transfer the data to a computing device using a single adapter. The apparatus may be embodied in a variety of devices including a passive flash memory card adapter, or an intelligent flash memory card reader. Nevertheless, it is understood that various modification can be made without departing from the spirit and scope of the invention. For example, the apparatus could be modified to accommodate alternative or additional memory card sizes. These and other embodiments are within the scope of the following claims.

The invention claimed is:

1. An apparatus comprising:
   a housing defining a slot to receive one of at least four different types of removable memory cards, wherein the slot includes:
      a central region having a width to receive a memory card of a first type,
      first outer regions that extend the width of the central region to a second width to receive a memory card selected from a second type of memory card and a third type of memory card, and
      second outer regions that extend the width of the central region to a third width to receive a memory card of a fourth type; and
   a plurality of electrically conductive contact areas to provide electrical contact with the four different types of memory cards.

2. The apparatus of claim 1, wherein at least a portion of each of the contact areas is disposed within the central region of the slot.

3. The apparatus of claim 1 further comprising a bias mechanism coupled to the housing to bias a memory card toward the contact areas.

4. The apparatus of claim 1, further comprising a bias mechanism coupled to the housing within the central region of the slot to bias memory cards toward a first side of the central region of the slot.

5. The apparatus of claim 4, wherein the bias mechanism biases a memory card to move the memory card a distance of at least approximately 3.5 mm from a second side of the central region of the slot.

6. The apparatus of claim 1, further comprising an insertion stop within the central region of the slot to limit an insertion depth of a memory card of a predetermined width or greater.

7. The apparatus of claim 1, wherein the housing has dimensions substantially conforming to a size specification of a CompactFlash removable memory card.

8. The apparatus of claim 1, wherein the central region of the slot has a height of approximately 2.8 mm and a width of at least approximately 24 mm.

9. The apparatus of claim 1,
   wherein the width of the central region is at least approximately 21.5 mm,
   wherein the first outer regions extend the width of the central region to at least approximately 24 mm, and
   wherein the second outer regions extend the width of the central region to at least approximately 37 mm.

10. The apparatus of claim 1, further comprising an electrically conductive interface for coupling to a memory card reader.

11. The apparatus of claim 1, further comprising an electrically conductive interface for coupling the apparatus to a connector for one of a Personal Computer Memory Card International Association (PCMCIA) bus, a Universal Serial Bus (USB) interface, a serial interface, a parallel interface, and a Small Computer System Interface (SCSI) interface.

12. The apparatus of claim 1, further comprising circuitry for converting signals received from the contact areas.

13. The apparatus of claim 1, wherein the circuitry converts the signals to conform to one of a Personal Computer Memory Card International Association (PCMCIA) bus, a Universal Serial Bus (USB), a serial interface, a parallel interface, and a small computer system interface (SCSI) interface.

14. The apparatus of claim 1, wherein the plurality of contact areas comprises:
   a first contact area for electrically coupling to a Smart Media memory card;
   a second contact area for electrically coupling to a Memory Stick memory card; and
   a third contact area for electrically coupling to a Secure Digital memory card or a MultiMedia memory card.

15. The apparatus of claim 1,
   wherein the housing defines the width of the central region to receive a Memory Stick removable memory card,
   wherein the first outer regions extend the width of the central region to receive at least one of a MultiMedia removable memory card and a Secure Digital removable memory card, and
   wherein the second outer regions extend the width of the central region to receive a Smart Media removable memory card.

16. The apparatus of claim 1, wherein the apparatus comprises an adapter or a memory card reader.

17. An apparatus comprising:
   a plurality of electrically conductive contact areas disposed within a cavity to provide electrical contact with at least four different types of removable memory cards,
   wherein the cavity includes:
      a central region having a width to receive a Memory Stick removable memory card,
      first outer regions that extend the width of the central region to a second width to receive a MultiMedia removable memory card or a Secure Digital removable memory card, and
      second outer regions that extend the width of the central region to a third width to receive a Smart Media removable memory card.

18. A system comprising:
   an adapter having a slot to receive one of at least four different types of removable memory cards, wherein the slot includes a central region having a width to receive a memory card of a first type, first outer regions that increase the width of the central region to a second width to receive a memory card selected from a second type of memory card or a third type of memory card, and second outer regions that increase the width of the central region to a third width to receive a memory card of a fourth type; and a computing device having a port to receive the adapter.

19. The system of claim 18, wherein the port of the computing device comprises one of a Personal Computer Memory Card International Association (PCMCIA) interface, a Universal Serial Bus (USB) interface, a serial interface, a parallel interface, and a Small Computer System Interface (SCSI) interface.

20. An apparatus comprising:

a housing defining a slot with a plurality of differently sized regions to receive at least four different types of memory cards, wherein the plurality of differently sized regions of the slot includes:

a first region having a first width to receive a memory card of a first type, a second region having a second width greater than the first width, the second width being sized to receive a memory card selected from a second type of memory card and a third type of memory card, and a third region having a third width greater than the first width and greater than the second width, the third width being sized to receive a memory card of a fourth type; and a plurality of electrically conductive contact areas to provide electrical contact with the four different types of memory cards.

* * * * *